United States Patent [19]

Takeshima et al.

[11] Patent Number: 5,436,910
[45] Date of Patent: Jul. 25, 1995

[54] DYNAMIC RANDOM ACCESS MEMORY DEVICE HAVING A PARALLEL TESTING MODE FOR PRODUCING ARBITRARY TEST PATTERN

[75] Inventors: Toshio Takeshima; Tadahiko Sugibayashi; Isao Naritake, all of Tokyo, Japan

[73] Assignee: NEC Corporation, Tokyo, Japan

[21] Appl. No.: 124,038

[22] Filed: Sep. 21, 1993

[30] Foreign Application Priority Data

Sep. 25, 1992 [JP] Japan ................... 4-256650

[51] Int. Cl.⁶ .................................... G06F 11/00
[52] U.S. Cl. .................... 371/21.1; 371/21.2; 365/201
[58] Field of Search ............. 371/21.1, 27, 21.2; 365/201; 395/425

[56] References Cited

U.S. PATENT DOCUMENTS

| | | | |
|---|---|---|---|
| 5,172,339 | 12/1992 | Noguchi et al. | 365/201 |
| 5,185,744 | 2/1993 | Arimoto et al. | 371/21.2 |
| 5,222,038 | 6/1993 | Tsuchida et al. | 365/204 |
| 5,233,610 | 8/1993 | Nakayama et al. | 371/5.1 |
| 5,267,212 | 11/1993 | Takashima | 365/201 |
| 5,272,673 | 12/1993 | Sugibayashi | 365/201 |

FOREIGN PATENT DOCUMENTS 61-261895 11/1986 Japan.
63-37894 2/1988 Japan.

OTHER PUBLICATIONS

Yamada et al., "A 64Mbit DRAM with Merged Match-Line Test Architecture", Technical Report of Electronic Information Communication Society, vol. 90, No. 496, SDM90-199, Mar. 1991, pp. 27-33.

Primary Examiner—Robert W. Beausoliel, Jr.
Assistant Examiner—Ly V. Hua
Attorney, Agent, or Firm—Sughrue, Mion, Zinn, Macpeak & Seas

[57] ABSTRACT

A semiconductor random access memory device is subjected to a parallel testing operation to see whether or not a defective memory cell is incorporated in the semiconductor random access memory device; in the parallel testing operation, a test bit of logic "1" level is sequentially written into a first predetermined address of each of data storage blocks by changing a column address, then, a test bit of logic "0" level is written into a second predetermined address of each of the data storage blocks by changing the column address again, and the write-in operation is repeated so as to form a checker-like bit pattern in each data storage block; after the formation of the test pattern, the test bits are sequentially read out from the first predetermined address of the data storage blocks to a read and write data bus system to see whether or not any one of the test bits are inconsistent with the other test bits so that the parallel testing is carried out on various bit patterns.

4 Claims, 8 Drawing Sheets

DYNAMIC RANDOM ACCESS MEMORY DEVICE HAVING A PARALLEL TESTING MODE FOR PRODUCING ARBITRARY TEST PATTERN

FIELD OF THE INVENTION

This invention relates to a semiconductor memory device and, more particularly, to a dynamic random access memory device having a parallel testing architecture on the memory cells.

DESCRIPTION OF THE RELATED ART

The dynamic random access memory device is progressively increasing the memory cells integrated therein, and time period for a diagnosis is prolonged together with the integration density. One of the approaches for accelerating the diagnosis is known as a parallel testing architecture where a plurality of memory cells more than input test bits are simultaneously checked to see whether or not a defective memory cell is incorporated in the memory cell array.

A typical example of the dynamic random access memory device is disclosed in Japanese Unexamined Publication No. 61-261895, and FIG. 1 illustrates the circuit arrangement disclosed therein. A memory cell array 1 is implemented by a plurality of addressable memory cells, and is associated with a multiplexer 2, a data output unit 3 and a parallel testing unit 4. The memory cell array 1 is electrically connected through a plurality of data lines 5 with a multiplexer 2, and the multiplexer 2 is responsive to address signals indicative of one of the data lines 5 for transferring a data bit on the selected data line to the output unit 3.

The output unit 3 comprises a shifter 3a and an output buffer 3b electrically connected through an output pad 3b with an output pin (not shown). The shifter 3a has two input nodes respectively connected with the output node of the multiplexer 2 and the output node of the parallel testing unit 4, and is responsive to a mode control signal P1 for transferring the selected data bit or a judging signal to the output buffer 3b. Namely, the shifter 3a comprises an inverter 3d for producing the complementary signal of the mode control signal P1, two OR gates 3e and 3f selectively enabled with the mode control signal P1 of logic "0" level and the complementary signal thereof, and an AND gate 3g connected with the output nodes of the OR gates 3e and 3f. The output node of the multiplexer 2 and the output node of the parallel testing unit 4 are respectively connected with the other input nodes of the respective OR gates 3e and 3f, and, for this reason, the selected data bit or the judging signal is transferred through the enabled OR gate 3e or 3f to the output buffer 3b.

The parallel testing unit 4 is implemented by an exclusive-OR gate, and is electrically connected through auxiliary data lines 6 with the memory cell array 1. A data signal P2 indicative of a test bit is further supplied to the exclusive-OR gate 4, and the exclusive-OR gate 4 compares the read-out data bits and the data signal P2 with one another for producing the judging signal.

The prior art random access memory device thus arranged selectively enters a standard mode and a parallel testing mode of operation. While the mode control signal P1 is in logic "1" level indicative of the parallel testing mode, the OR gate 3e is disabled, and the other OR gate 3f is enabled with the complementary signal of logic "0" level. The OR gate 3e produces the output signal of logic "1" level regardless of the output signal of the multiplexer 2.

The test bit indicated by the test signal P2 is written into the memory cells of the array 1, and the test bits are read out from a row of memory cells to the data lines 5. The test bits are transferred through the auxiliary data lines 6 to the exclusive-OR gate 4, and the exclusive-OR gate 4 checks the read-out test bits and the original test bit represented by the test signal P2 to see whether or not any one of the test bits is different in logic level from the other test bits. If all of the read-out test bits and the original test bit are consistent with one another, the row of memory cells are diagnosed to be excellent, and the exclusive-OR gate 4 produces the judging signal of logic "0" level. The enabled OR gate 3f transfers the judging signal through the AND gate 3g to the output buffer 3b. On the other hand, if any one of the read-out test bits and the original test bit is inconsistent with the other test bits, the exclusive-OR gate acknowledges a defective memory cell in the row of memory cells, and shifts the judging signal to logic "1" level. The judging signal is also transferred through the enabled OR gate 3f and the AND gate 3g to the output buffer 3b. In either case, the judging signal is output from the output buffer 3b through the output pad 3c to the output pin.

When the mode signal P1 is changed to logic "0" level, the prior art dynamic random access memory device enters the standard mode, and the OR gate 3e is enabled. However, the other OR gate 3f is disabled with the complementary signal of the mode control signal P1. In this situation, data bits are read out from a row of memory cells to the data lines 5, and the multiplexer 2 selects one of the data bits in response to the address signals. The selected data bit is transferred through the enabled OR gate 3e and the AND gate 3g to the output buffer 3b. The output buffer 3b produces an output data signal from the selected data bit, and the output data signal is output through the output pad 3c to the output pin. Therefore, the output pad 3c and, accordingly, the output pin are shared between the parallel testing mode and the standard mode.

The prior art parallel testing unit 4 accelerates the testing operation on the memory cells without any output pad exclusively used. However, the prior art parallel testing architecture concurrently examines only a row of memory cells, and is expected to repeat the parallel testing operation on the individual rows. Therefore, if the rows of memory cells are increased, the prior art parallel testing architecture is less effective.

Moreover, it is necessary to write a test bit of either logic level into the memory cells. If a test bit of logic "1" level and a test bit of logic "0" level are alternately written into the memory cells, the exclusive-OR can not discriminate the test bit read out from the defective memory cell. Therefore, the prior art parallel testing architecture sets a limit on the patter of test bits stored in the memory cells.

Japanese Unexamined Publication No. 63-37894 discloses a parallel testing architecture. However, the parallel testing architecture is similar to that described hereinbefore, and no further description is incorporated in this specification.

Another prior art parallel testing architecture is disclosed in "A 64 Mbit DRAM with Merged Match-line Test Architecture by Yamada et al, Technical Report of Electronic Information Communication Society, vol. 90, No. 496, SDM90-199, pages 27 to 33, March 1991. FIG. 2 illustrates an essential part of the prior art dynamic random access memory device disclosed in the technical report. Although write-in circuits are incorporated in the prior art dynamic random access memory device, FIG. 2 is focused on read-out/comparing circuits.

The prior art dynamic random access memory device comprises a memory cell array 11, and the memory cell array 11 is constituted by memory cells M10, M11, M12, M20, M21 and M22 represented by small circles. The memory cells are selectively connected with bit line pairs B00/B01, B10/B11 and B20/B21, and word lines W0 and W1 allow data bits to be selectively read out from and written into the memory cells M10 to M22. An address decoder/word line driver 12 is responsive to address predecoded signals, and drives one of the word lines W0 and W1 to active level.

A plurality of sense amplifiers SA0, SA1 and SA2 are respectively connected with the bit line pairs B00/B01 to B20/B21, and increase potential differences on the bit line pairs B00/B01 to B20/B21, respectively.

A plurality of read-out/comparing circuits RC0, RC1 and RC2 are further associated with the bit line pairs B00/B01 to B20/B21, and are connected between the bit line pairs B00/B01 to B20/B21 and a pair of data lines D0 and D1. Each of the read-out/comparing circuits RC0 to RC2 comprises two series combinations of n-channel enhancement type switching transistors Q1/Q2 and Q3/Q4 connected between the data lines D0/D1 and the ground voltage line. The read-out/comparing circuits RC0 to RC2 are associated with the selecting lines YS0 to YS2, and the n-channel enhancement type switching transistors Q1 and Q3 are gated by the associated selecting line YS0, YS1 or YS2. The other n-channel enhancement type switching transistors Q2 and Q4 are respectively gated by the associated bit lines B00/B01, B10/B11 or B20/B21, and the read-out/comparing circuits RC0 to RC2 selectively connect the data lines D0 and D1 with the ground voltage line.

The data lines D0 and D1 are connected with a precharging circuit 13, and an error detection circuit 14 monitors the data lines D0 and D1. In this instance, the error detection circuit 14 is implemented by a NOR gate.

The prior art dynamic random access memory device thus arranged behaves in a test mode as follows. A test bit is firstly written into all of the memory cells M10 to M22, and the bit line pairs B00/B01 to B20/B21 and the data lines D0/D1 are precharged to an intermediate voltage level between high and low voltage levels. The data lines D0 and D1 are precharged to the high voltage level, and the address decoder/word line driver 12 drives one of the word lines W0 and W1 to the active level.

The test bits are read out from the memory cells coupled with the word line driven to the active level, and small potential differences take place on the associated bit line pairs B00/B01 to B20/B21, respectively. The sense amplifiers SA0 to SA2 are activated, and increase the potential differences on the bit line pairs B00/B01 to B20/B21.

In the test mode, since all of the selecting lines YS0 to YS2 go up to the high voltage level, the n-channel enhancement type switching transistors Q1/Q3 turn on, and all of the read-out/comparing circuits RC0 to RC2 are simultaneously enabled for providing current paths to the ground voltage line.

If the memory cells coupled with the selected word line are excellent, the test bits read out therefrom are identical in logic level, and the n-channel enhancement type switching transistors either Q2 or Q4 turn on for electrically connecting the associated data line D0 or D1 with the ground voltage line. However, the other data line D1 or D0 is isolated from the ground voltage line, and maintains the high voltage level. As a result, the high voltage level or logic "1" level and the low voltage level or logic "0" level are supplied to the NOR gate 14, and the NOR gate 14 keeps an error detecting signal at inactive low voltage level.

However, if a defective memory cell is incorporated in the selected memory cells, the test bit read out therefrom is complementary to the test bits read out from the other excellent memory cells. The test bit read out from the defective memory cell, by way of example, causes the n-channel enhancement type switching transistor Q2 of the associated read-out/comparing circuit to turn on, and the other test bits allow the n-channel enhancement type switching transistors Q4 of the associated read-out/comparing circuits to turn on. As a result, both data lines D0 and D1 are electrically connected with the ground voltage line, and the low voltage levels or logic "0" levels are supplied to the NOR gate 14. Then, the NOR gate 14 produces the error signal of the high voltage level, and an analyst diagnoses the product to be defective on the basis of the error signal.

Thus, the second prior art parallel testing architecture also accelerates the diagnosis, and a circuit arrangement for the parallel testing may be simpler than that of the first prior art example. However, the second prior art parallel testing architecture merely allows the read-out/comparing circuits RC0 to RC2 to check the test bits read out from only one row of memory cells, and is expected to repeat the testing operation as similar to the first prior art parallel testing architecture.

Moreover, it is necessary for the test bits read out from a row of memory cells to be in either logic level, and the second prior art parallel testing architecture also sets the limit on the pattern of test bits.

In general, if data bits stored in adjacent memory cells are complementary to each other, the data bits tend to be affected, and a defective memory cell inverts one of the data bits. 2In order to screen out such a defective memory cell, it is necessary to alternately write a test bit of logic "1" level and a test bit of logic "0" into the memory cells. However, both first and second prior art parallel testing architectures can not examine the memory cells storing such an alternate bit pattern through the parallel testing operation.

SUMMARY OF THE INVENTION

It is therefore an important object of the present invention to provide a dynamic random access memory device which carries out a parallel testing operation with various patterns of test bits.

To accomplish the object, the present invention proposes to sequentially write a test bit into predetermined data storage blocks and another test bit into other predetermined data storage blocks for forming a checker pattern of the test bits.

In accordance with one aspect of the present invention, there is provided a semiconductor dynamic random access memory device having a standard mode of operation for selectively writing data bits and selectively reading out the data bits, and a parallel testing mode of operation for sequentially writing test bits and sequentially reading out the test bits, comprising: a) a plurality of data storage blocks arranged in rows and columns, each of the plurality of data storage blocks having a-1) a plurality of addressable memory cells for respectively storing the data bits or the test bits, a-2) a plurality of sub-word lines selectively connected with the plurality of addressable memory cells, and selectively driven to an active level so that selected memory cells of the plurality of addressable memory cells become accessible, a-3) a partial decoder unit connected with the plurality of sub-word lines, and driving one of the sub-word lines to the active level, and a-4) a plurality of sense amplifier circuits selectively connected with the plurality of addressable memory cells for amplifying potential differences indicative of the data bits or the test bits; b) a plurality of block selecting lines respectively associated with the columns of data storage blocks, and selectively driven to an active level for enabling the partial decoder units of a column of data storage blocks; c) a column address decoder unit connected with the plurality of block selecting lines, and responsive to first address bits for driving one of the block selecting lines to the active level; d) a plurality of main word line groups respectively associated with the rows of the plurality of data storage blocks, and each connected with the partial decoder units of the data storage blocks in the associated row for allowing the partial decoder unit of one of the data storage blocks in the selected column to selectively driving the sub-word lines; e) a row address decoder unit connected with the plurality of main word line groups, and responsive to second address bits for selectively driving one of the plurality of main word line groups to an active level; f) a plurality groups of data propagation paths respectively associated with the columns of data storage blocks, each group of data propagation paths being connected with the sense amplifier circuits of each of the data storage blocks in the associated column for transferring the potential differences; g) an input and output means operative to receive an input data and output an output data in the standard mode and to sequentially receive the test bits and output a diagnostic signal in the parallel testing mode, and having a read and write bus system for propagating the input data, the output data and the test bits in the form of potential difference; h) a plurality of line selecting means respectively associated with the plurality groups of data propagation paths, and each selectively connecting the data propagation paths of the associated group with the read and write bus system, the block selecting lines being sequentially driven to the active level for writing each of the test bits into predetermined data storage blocks in the parallel testing mode, the block selecting lines being sequentially driven to the active level for reading out the data bits from the predetermined data storage blocks in the parallel testing mode; and i) a diagnostic means associated with the input and output means, and monitoring potential levels on the read and write bus system in the parallel testing mode to see whether or not the test bits sequentially read out from the predetermined data storage blocks are identical in logic level for producing the diagnostic signal indicative of consistence or inconsistence.

In accordance with another aspect of the present invention, there is provided a semiconductor dynamic random access memory device having a standard mode of operation for selectively writing data bits and selectively reading out the data bits, and a parallel testing mode of operation for sequentially writing test bits and sequentially reading out the test bits, comprising: a) a plurality of data storage blocks arranged in rows and columns, each of the plurality of data storage blocks having a-1) a plurality of addressable memory cells for respectively storing the data bits or the test bits, a-2) a plurality of sub-word lines selectively connected with the plurality of addressable memory cells, and selectively driven to an active level so that selected memory cells of the plurality of addressable memory cells become accessible, a-3) a partial decoder unit connected with the plurality of sub-word lines, and driving one of the sub-word lines to the active level, and a-4) a plurality of sense amplifier circuits selectively connected with the plurality of addressable memory cells for amplifying potential differences indicative of the data bits or the test bits; b) a plurality of block selecting lines respectively associated with the columns of data storage blocks, and selectively driven to an active level for enabling the partial decoder units of a column of data storage blocks; c) a column address decoder unit connected with the plurality of block selecting lines, and responsive to first address bits for driving one of the block selecting lines to the active level; d) a plurality of main word line groups respectively associated with the rows of the plurality of data storage blocks, and each connected with the partial decoder units of the data storage blocks in the associated row for allowing the partial decoder unit of one of the data storage blocks in the selected column to selectively driving the sub-word lines; e) a row address decoder unit connected with the plurality of main word line groups, and responsive to second address bits for selectively driving one of the plurality of main word line groups to an active level, the row address decoder unit being operative to sequentially drive the plurality of main word line groups in the parallel testing mode for wring each of the test bits into predetermined data storage blocks, the row address decoder unit further being operative to sequentially drive the plurality of main word line groups in the parallel testing mode so that the test bits are read out from the predetermined data storage blocks; f) a plurality groups of data propagation paths respectively associated with the columns of data storage blocks, each group of data propagation paths being connected with the sense amplifier circuits of each of the data storage blocks in the associated column for transferring the potential differences; g) an input and output means operative to receive an input data and output an output data in the standard mode and to sequentially receive the test bits and output a diagnostic signal in the parallel testing mode, and having a read and write bus system for propagating the input data, the output data and the test bits in the form of potential difference; h) a plurality of line selecting means respectively associated with the plurality groups of data propagation paths, and each selectively connecting the data propagation paths of the associated group with the read and write bus system; and i) a diagnostic means associated with the input and output means, and monitoring potential levels on the read and write bus system in the parallel testing mode to see whether or not the test bits sequentially read out from the predetermined data storage blocks are identical in logic level for producing the diagnostic signal indicative of consistence or inconsistence.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
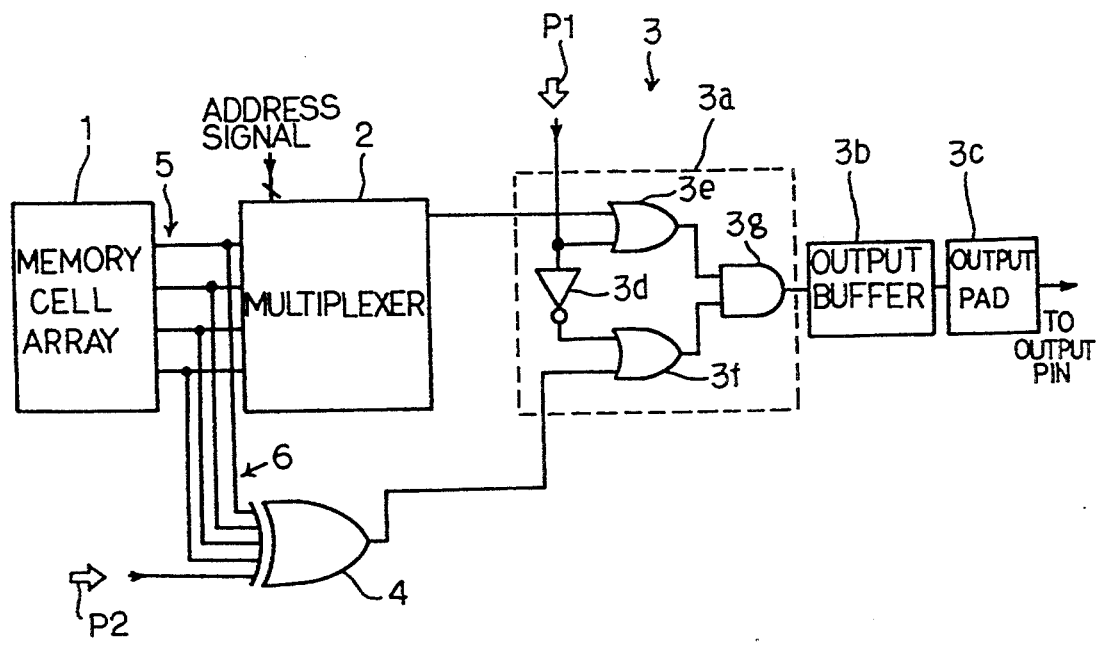
FIG. 1 is a circuit diagram showing the first prior art dynamic random access memory device.
Figure 2:
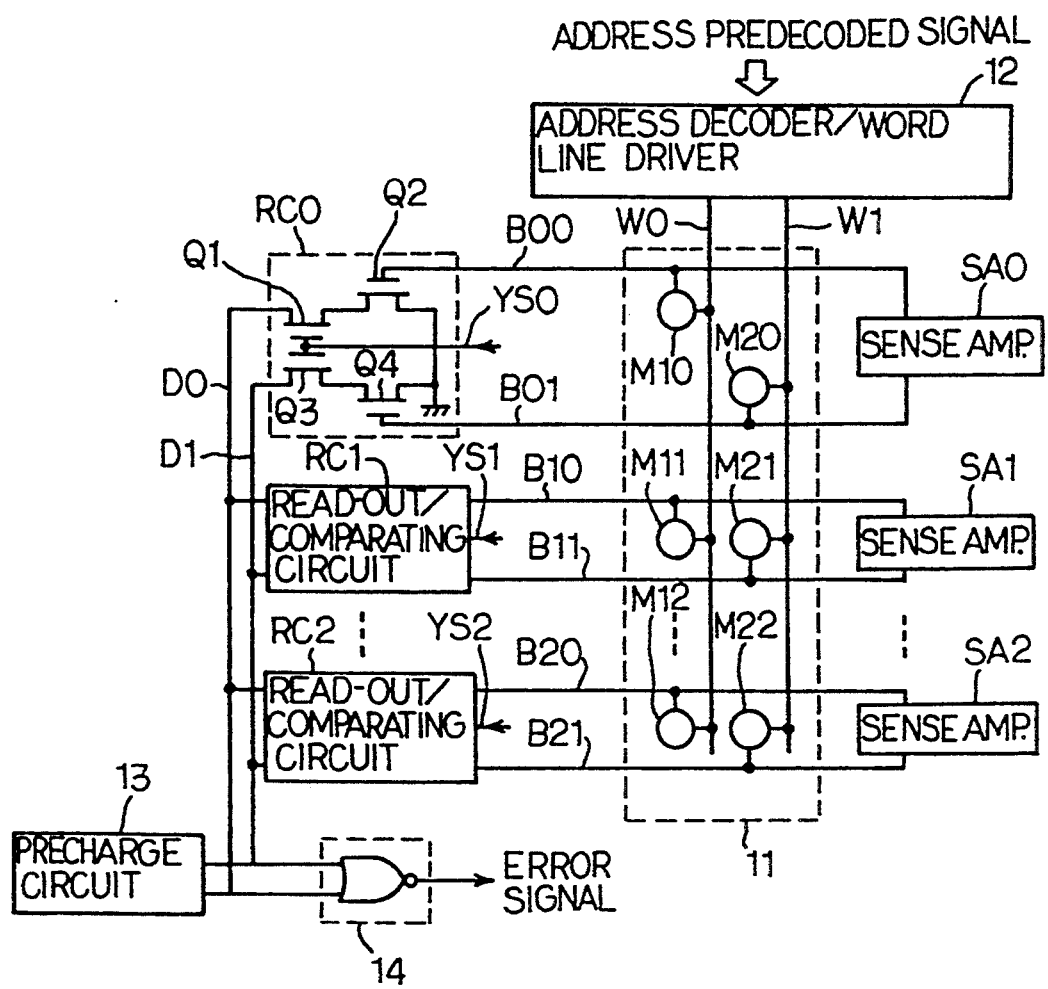
FIG. 2 is a circuit diagram showing the essential part of the second prior art dynamic random access memory device.
Figure 3:
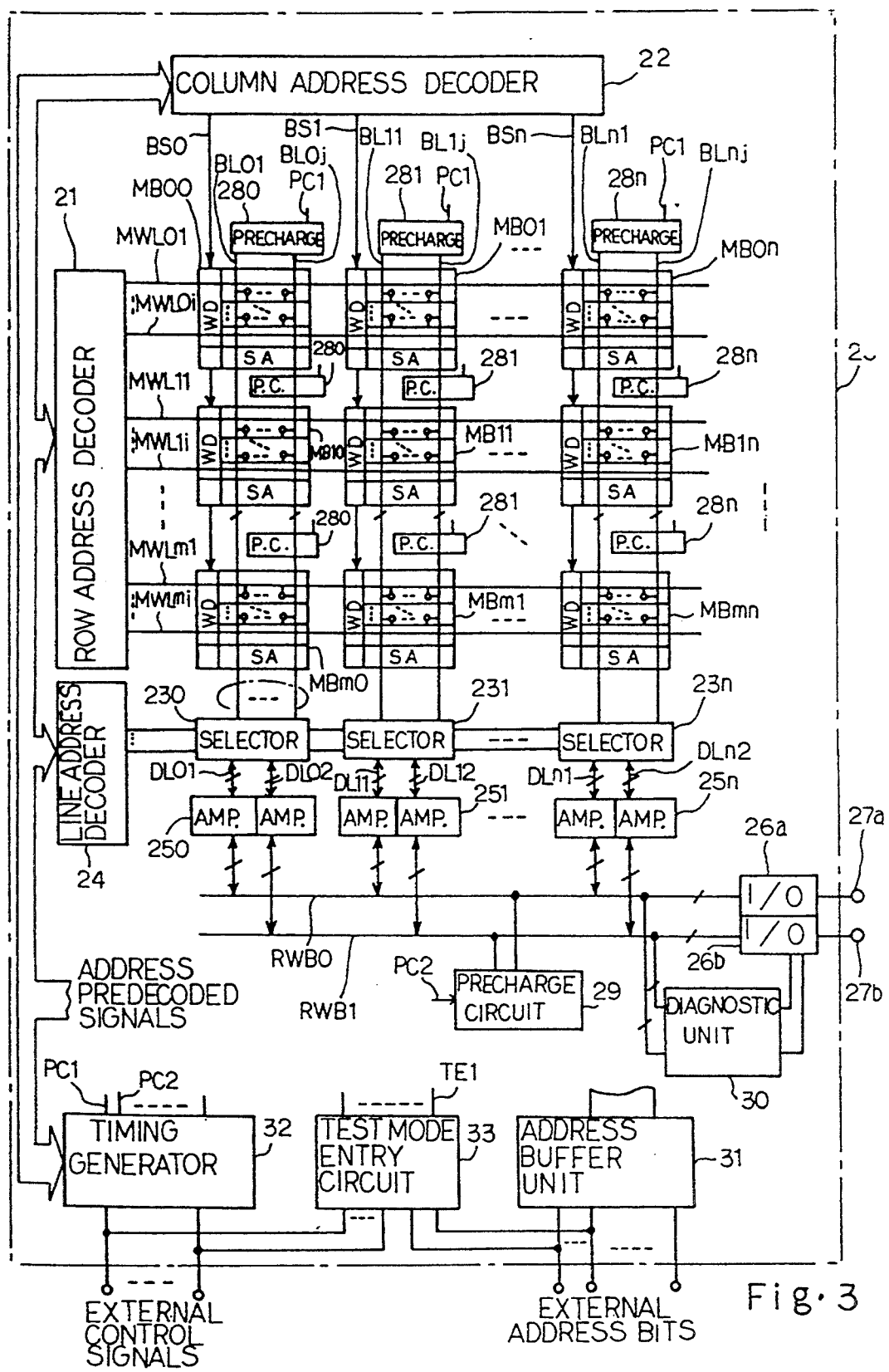
FIG. 3 is a circuit diagram showing the circuit arrangement of a dynamic random access memory device according to the present invention.

Referring to FIG. 3 of the drawings, a dynamic random access memory device embodying the present invention is fabricated on a semiconductor chip 20, and comprises a plurality of data storage blocks MB00, MB01, ..., MB0n, MB10, MB11, ..., MB1n, MBm0, MBm1, ... and MBmn arranged in rows and columns.

A plurality groups of main word lines MWL01 to MWL0i, MWL11 to MWL1i, ... and MWLm1 to MWLmi are respectively associated with the rows of data storage blocks MB00 to MBmn, and primary row addresses are respectively assigned to the rows of data storage blocks MB00 to MBmn and, accordingly, to the main word line groups MWL01/MWL0i to MWLm1/MWLmi. A row address decoder 21 selects one of the main word line groups MWL01/MWL0i to MWLm1/MWLmi and a row of data storage blocks associated therewith.

A plurality of block selecting lines BS0, BS1, ... and BSn are further associated with the columns of data storage blocks MB00 to MBmn, and column addresses are respectively assigned to the columns of data storage blocks MB00 to MBmn and, accordingly, the block selecting lines BS0 to BSn. A column address decoder 22 selectively drives the block selecting lines BS0 to BSn, and selects a column of data storage blocks. Therefore, each of the data storage blocks MB00 to MBmn is selected by one of the main word line groups MWL01 to MWL0i to MWLm1 to MWLmi and one of the block selecting lines BS0 to BSn.

Figure 4:
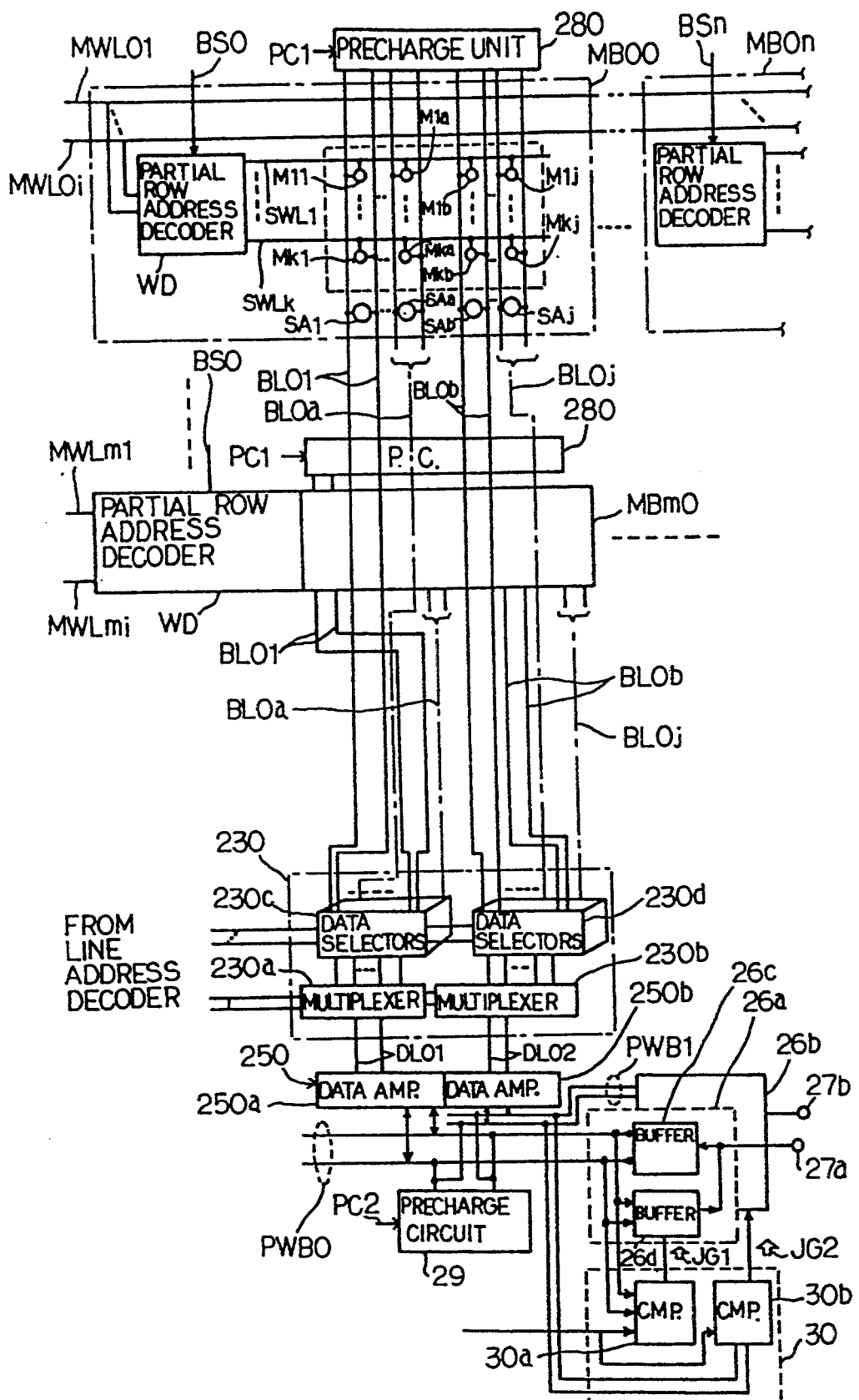
FIG. 4 is a circuit diagram showing the circuit arrangement of a data storage block associated with a selector unit according to the present invention.

A plurality groups of bit line pairs BL01/BL0j, BL11/BL1, ... and BLn1/BLnj are respectively associated with the data storage blocks MB00 to MBmn, and the bit line pairs BL01/BL0j, BL11/BL1 j, ... or BLn1/BLnj are grouped for each column of data storage blocks MB00 to MBmn (see FIG. 4). Each group of the bit line pairs BL01, ..., BL0j, ..., BL11, ..., BLn1, ... or BLnj consitute a data propagation path. However, the bit line pair BL01 to the bit line pair BL0j may be shared between one of the columns of the data storage blocks.

The plurality groups of bit line pairs BL01/BL0j to BLn1/BLnj are terminated at a plurality of selector units 230, 231, ... and 23n, respectively, and each selector unit 230, ... or 23n is shared between the groups of bit line pairs BL01/BL0j, ... or BLn1/BLnj associated with one of the columns of data storage blocks. The selector units 230 to 23n are controlled by a line address decoder 24. Line addresses are respectively assigned to the bit line pairs of each group, and the line address decoder 24 causes each of the selector units 230 to 23n to electrically connect two of the bit line pairs of one of the groups of bit line pairs BL01/BL0j, ... or BLn1/BLnj with an associated data amplifier 250, 251, ... or 25n through data line pairs DL01/DL02, DL11/Dl12, ... and DLn1/DLn2. A read/write data bus system RWB0/RWB1 is shared between the data amplifier units 250 to 25n, and electrically connects two input and output units 26a and 26b with the data amplifier units 250 to 25n. The input and output units 26a ad 26b are connected with data input and output pins 27a and 27b, respectively.

The plurality groups of bit line pairs BL01/BL0j to BLn1/BLnj are further connected with a plurality of precharging units 280, 281, ... and 28n, and the plurality of precharging units 280 to 28n respectively charge the bit line pairs BL01/BL0j to BLn1/BLnj to an intermediate voltage level in response to a precharge control signal PC1 before every access.

The data storage blocks MB00 to MBmn are similar in arrangement to one another, and the data storage block MB00 is, by way of example, described hereinbelow with reference to FIG. 4. The data storage block MB00 largely comprises memory cells M11, M1a, ..., M1b, M1j, Mk1, Mka, ..., Mkb and Mkj, a partial row address decoder WD connected with the main word lines MWL01 to MWL0i for selectively driving sub-ward lines SWL1 to SWLk and a plurality of sense amplifier circuits SA1, SAa, ..., SAb and SAj associated with the bit line pairs BL01, BL0a, ..., BL0b and BL0j. Secondary row addresses are respectively assigned to the sub-word lines SWL1 to SWLk and, accordingly, to the rows of memory cells M11 to Mkj. On the other hand, the bit line pairs are broken down into two sub-groups BL01 to BL0a and BL0b to BL0j, and line addresses are assigned to the respective bit line pairs BL01 to BL0a and the respective bit line pairs BL0b to BL0j. Therefore, each line address is indicative of two bit line pairs in one of the bit line groups BL01/BL0j to BLn1/BLnj. The memory cells M11 to Mkj are of a one-transistor one-capacitor type, and a data bit is stored therein in the form of electric charge.

The columns of memory cells M11 to Mkj are respectively associated with the bit line pairs BL01 to BL0j of the associated group, and the drain nodes of the memory cells in each column are alternately connected with the bit lines of the associated pair.

The sub-word lines SWL1 to SWLk are respectively associated with the rows of memory cells M11 to Mkj, and each of the sub-word lines SWL1 to SWLk are coupled with the gate of the memory cells in the associated row. The partial row address decoder WD is enabled with the associated block selecting line BS0, and becomes responsive to the associated main word lines MWL01 to MWLmi for driving one of the sub-word lines SWL1 to SWLk to an active level.

The memory cells coupled with the sub-word line driven to the active level become conductive with the bit lines of the associated precharged pairs BL01 to BL0j, and potential differences indicative of the stored data bits take place on the bit line pairs BL01 to BL0j, respectively.

The sense amplifier circuits SA1 to SAj are concurrently powered with high and low power voltage levels, and develop or increase the potential differences indicative of data bits.

The selector unit 230 comprises two multiplexers 230a and 230b and two groups of data selectors 230c and 230d, and the multiplexers 230a and 230b and the data selector groups 230c and 230d are under the control of the line address decoder 24. The bit line pairs of each group BL01 BL0j are divided into two sub-groups, i.e., the bit line pairs BL01 to BL0a and the bit line pairs BL0b to BL0j. The multiplexer 230a and the data selector 230c select a bit line pair from the first sub-groups, and electrically connect the data line pair DL01 with the selected bit line pair. Similarly, the other multiplexer 230b and the other data selector group 230d select a bit line pair from the second sub-groups, and electrically connects the data line pair DL02 with the selected bit line pair.

The other selector units 231 to 23n are similar in arrangement to the selector unit 230, and no further description is incorporated hereinbelow.

The data amplifier unit 250 has two data amplifiers 250a and 250b, and are connected between the read/write data bus PWB0 and the data line pair DL01 and between the read/write data bus PWB1 and the data line pair DL02, respectively.

Figure 5:
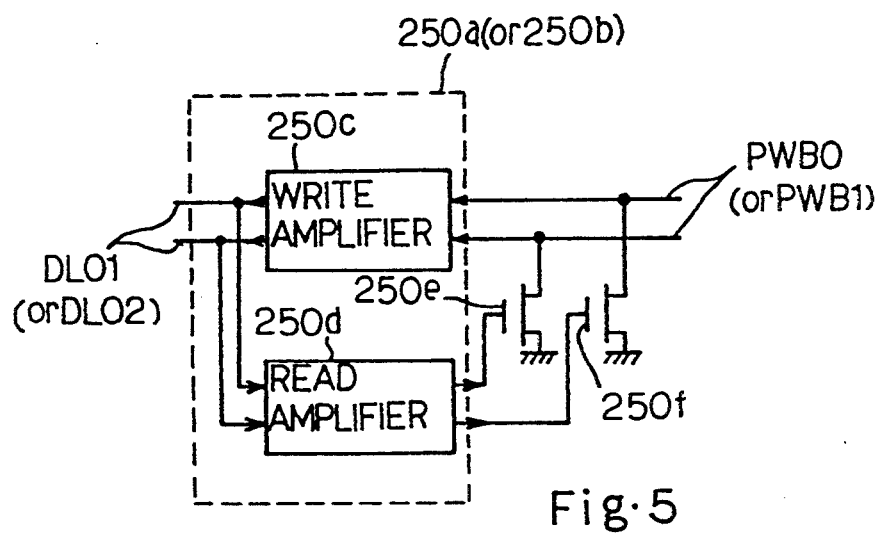
FIG. 5 is a circuit diagram showing the arrangement of a data amplifier incorporated in the dynamic random access memory device according to the present invention.

As will be illustrated in FIG. 5, each of the data amplifiers 250a and 250b comprises a write amplifier 250c and a read amplifier 250d, and the read amplifier 250d is associated with two n-channel enhancement type discharging transistors 250e and 250f. The write amplifier 250 is operative to increase a potential difference indicative of a write-in data bit on the read/write data bus PWB0 or PWB1, and supplies the increased potential difference to the data line pair DL01 or DL02. On the other hand, the read amplifier 250d is responsive to a potential difference indicative of a read-out data bit on the data line pair DL01 or DL02, and produces gate control signals complementary to each other. The n-channel enhancement type discharging transistors 250e and 250f have respective source-to-drain paths connected between the read/write bus PWB0 or PWB1 and a ground voltage line. The gate control signals are supplied from the read amplifier 250d to the gate electrodes of the n-channel enhancement type discharging transistors 250e and 250f, and the n-channel enhancement type discharging transistors 250e and 250f complementarily turn on and off depending upon the read-out data bit.

Turing back to FIG. 4, a precharging circuit 29 is connected with the read/write data buses PWB0 and PWB1, and charges the read/write data buses PWB0 and PWB1 to the high voltage level before the write-in data bit or the read-out data bit is transferred to thereto.

The input-and-output units 26a and 26b are similar in circuit arrangement to each other, and each of the input-and-output units 26a and 26b is implemented by an input data buffer 26c and an output data buffer 26d coupled in parallel between the associated input-and-output data pin 27a or 27b and the read/write data bus PWB0 or PWB1. The write-in data bit is supplied from the input-and-output data pin 27a or 27b to the input data buffer 26c, and the input data buffer 26c produces the potential difference on the associated read/write data bus PWB0 or PWB1 from the write-in data bit. The output data buffer 26d produces an output data signal or a diagnostic signal from the potential difference on the associated read/write data bus PWB0 or PWB1 or a judging signal JG1 or JG2 supplied from a diagnostic unit 30 described hereinbelow in detail.

The diagnostic unit 30 is implemented by two comparator circuits 20a and 20b, and the two comparator circuits 30a and 30b respectively monitor the read/write data bus PWB0 and the read/write data bus PWB1 for producing the judging signals JG1 and JG2, respectively.

Figure 6:
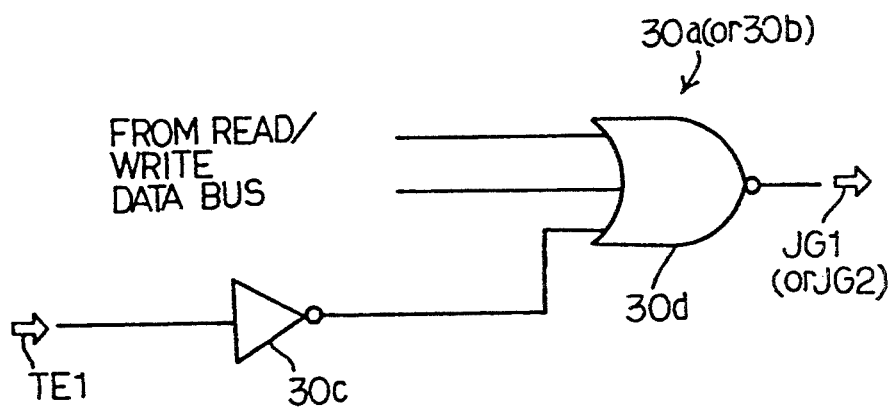
FIG. 6 is a logic diagram showing a diagnostic circuit incorporated in the dynamic random access memory device according to the present invention.

As shown in FIG. 6, each of the comparator circuits 30a and 30b comprises an inverter 30c supplied with a test enable signal TE1, and a NOR gate 30d supplied with the voltage levels on the associated read/write data bus PWB0 or PWB1 as well as the complementary test enable signal. The NOR gate 30d is enabled with the complementary test enable signal of the low voltage level corresponding to logic "0" level, and checks the voltage levels on the associated read/write data bus PWB0 or PWB1 to see whether or not the voltage levels supplied thereto are different from each other if the data lines of the associated read/write data bus PWB0 or PWB1 are different in voltage level, i.e., the high voltage level and the low voltage level, each of the comparator circuits 30a and 30b produces the judging signal JG1 or JG2 indicative of consistence between test bits. However, if both data lines are in the low voltage level, each of the comparator circuits 30a and 30b shifts the judging signal JG1 or JG2 to the high voltage level indicative of inconsistence between the test bits.

When the judging signal from the associated comparator 30a or 30b is indicative of the inconsistence, the output data buffer 26d produces the diagnostic signal indicative of a defect. On the other hand, if the judging signal remains in the low voltage level indicative of the consistence, the output data buffer supplies the diagnostic signal indicative of excellence.

Turning back to FIG. 3, the dynamic random access memory device further comprises an address buffer unit 31 connected with address pins for external address bits indicative of primary and secondary row addresses, a column address and a line address, and the address buffer unit 31 produces address predecoded signals for the row address decoder 21, the column address decoder 22 and the line address decoder 24.

A timing generating unit 32 is incorporated in the dynamic random access memory device, and is connected with control signal pins for external control signals such as, for example, a row address strobe signal, a column address strobe signal and a write enable signal. The timing generating unit 32 is responsive to the external control signals, and sequentially produces internal timing signals for controlling a write-in sequence and a read-out sequence.

The dynamic random access memory device further comprises a test mode entry circuit 33, and the test mode entry circuit 33 causes the dynamic random access memory device to enter a test mode for diagnosing the components thereof. In detail, when predetermined external control signals change in potential level into a predetermined pattern, the test mode entry circuit 33 acknowledges the test mode, and selectively produces test enable signals depending upon predetermined address bits. Namely, bit patterns of the predetermined address bits are respectively indicative of internal test sequences, and the test mode entry circuit 33 discriminates a requested test sequence on the basis of the predetermined address bits. One of the bit patterns is indicative of a parallel-bit testing sequence described hereinlater, and the test mode entry circuit 33 produces the test enable signal TE1 in the parallel-bit testing sequence.

In this instance, the data amplifier units 250 to 25n, the read and write data bus system PWB0 and PWB1, the input and output data buffer units 26a and 26b, the input and output data pins 27a, the precharging circuit 29 and the n-channel enhancement type discharging transistors 250e and 250f as a whole constitute an input and output means, and the selector units 230 to 230n and the line address decoder 24 form in combination a plurality of line selecting means.

Although other systems such as an auto-refreshing system and a power supply system are further incorporated in the dynamic random access memory device according to the present invention, these systems are not illustrated in the attached drawings, because they are less important for understanding the present invention.

The dynamic random access memory device thus arranged selectively enters a standard mode and the test mode. In the standard mode, the dynamic random access memory device carries out the write-in sequence for writing write-in data bits into one of the data storage blocks MB00 to MBmn and the read-out sequence for reading out read-out data bits from one of the data storage blocks MB00 to MBmn. Although a refreshing sequence is further carried out in the standard mode, no description is made thereon.

Assuming now that the predetermined external control signals do not change into the predetermined pattern, the dynamic random access memory device remains in the standard mode, and external address bits are sequentially latched by the address buffer unit 31 in synchronism with the external control signals such as address strobe signals.

The address buffer unit 31 produces a set of address predecoded signals indicative of a column address, and the column address decoder 22 acknowledges the row address for driving one of the block selecting signals BS0 to BSn to the active level. As a result, the block selecting signal driven to the active level simultaneously enables the partial row address decoders WD incorporated in one of the columns of data storage blocks.

The address buffer unit 31 further produces another set of address predecoded signals indicative of primary and secondary row addresses, and the row address decoder 21 selectively drives one of the groups of main word lines MWL01/MWL0i to MWLm1/MWLmi associated with the row of data storage blocks assigned the primary row address. However, the other groups of main word lines remain inactive.

Only one data storage block enabled with the block selecting signal is responsive to the selected group of main word lines, and drives one of the sub-word lines assigned the secondary row address to an active level. A row of memory cells connected with the selected sub-word line are electrically connected with the associated bit line pairs, and data bits stored therein are read out thereto for producing potential differences. The potential differences are amplified by the associated sense amplifier circuits SA1 to SAj.

Write-in data bits are supplied to the input and output data pins 27a and 27b, and are transferred to the input data buffer circuits 26c. The precharging circuit 29 has already charged the data buses PWB0 and PWB1 to the high voltage level. The input data buffer circuits 26c produces potential differences from the write-in data bits, and the potential differences are propagated through the data buses PWB0 and PWB1 to the write amplifiers 250c of the data amplifier units 250a and 250b incorporated in each data amplifier 250, . . . or 25n, respectively. The write amplifiers 250c of the data amplifier units 250a and 250b amplify the potential differences on the data buses PWB0 and PWB1.

The address buffer unit 31 further produces yet another set of address predecoded signals from the address bits indicative of a line address, and the line address decoder 24 causes each of the selector units 230 to 23n to connect the data buses PWB0 and PWB1 with two groups of bit line pairs assigned the line address. If the address predecoded signals are indicative of the leftmost bit line pairs of the two sub-groups, the bit line pairs BL01, the bit line pairs BL0b, . . . , and the bit line pairs BLn1 and the bit line pairs BLnb are coupled with the data buses PWB0 and PWB1.

Then, the potential differences indicative of the write-in data bits are transferred from the data amplifier units 250a and 250b to the selected bit line pairs associated with the selected data storage block. The potential differences indicative of the write-in data bits either invert or keep the potential differences already produced on the selected bit line pairs, and the write-in data bits are stored in the memory cells assigned the row, column and line addresses. The potential differences on the other bit line pairs associated with the selected data storage block are restored in the original memory cells. Even if the potential differences are further transferred to the bit line pairs associated with non-selected data storage blocks, the write-in data bits are never stored in the corresponding memory cells of the non-selected data storage blocks, because any sub-word line does not allow the memory cells to be conducted with the bit line pairs.

In the read-out sequence, after the potential differences on the bits line pairs are amplified by the sense amplifiers SA1 to SAj, the selector unit associated with the selected data storage unit connects the two bit line pairs assigned to the line address with the read amplifiers 250d of the data amplifier units 250a and 250b, and selects read-out data bits from the data bits stored in the selected data storage block. The read amplifiers 250d selectively discharge data bus lines of the data buses PWB0 and PWB1 already precharged to the high voltage level, and transfers the potential differences indicative of the read-out data bits to the data buses PWB0 and PWB1, respectively. The data buses PWB0 and PWB1 propagate the potential differences to the output data buffers 26d of the associated input and output data buffer units 26a and 26b, and the output data buffers 26d produce the output data signals indicative of the read-out data bits, respectively. The output data signals are supplied to the input-and-output data pins 27a and 27b.

However, in the standard mode, the test mode entry circuit 33 does not produce any test enable signal, and the diagnostic unit 30 is never responsive to the potential differences on the data buses PWB0 and PWB1.

On the other hand, if the external control signals change into the predetermined pattern in the presence of the address bits indicative of the parallel-bit testing sequence, the test mode entry circuit 33 acknowledges the parallel-bit testing sequence, and the dynamic random access memory device is subjected to the parallel-bit test.

An external diagnostic system (not shown) is expected to alternately arrange a test bit of logic "1" level and a test bit of logic "0" level over the data storage blocks MB00 to MBmn in a checker-like bit pattern. If the checker-like bit pattern have a first row of test bits "1010 . . . 1010", the second row of test bits have the bit string "0101 . . . 0101", and the bit string of the third row is "1010 . . . 1010".

First, the test bits of logic "1" level are applied to the input-and-output data pins 27a and 27b, respectively, and the external address bits select the memory cells M11 and M1b from the data storage block MB00. Although the test bits are transferred from the data amplifier units 250 to 25n through the selector units 230 to 23n to the bit line pairs BL01/BL0b to BLn1/BLnb assigned the line address, the test bits of logic "1" level are written into the memory cells M11 and M1b of the selected data storage block MB00 through the write-in sequence described hereinbefore, because the column address decoder and the row address decoder 22 and 21 activate the block selecting line BS0 only. The external address bits indicative of the column address are, then, changed to the block selecting line BS1, and are latched by the address buffer unit 31. The column address decoder 22 changes the activated block selecting line from BS0 to BS1, and the test bits of logic "1" level already transferred to the bit line pairs BL11 and BL1b are stored in the memory cells M11 and M1b of the data storage block MB01.

In this way, the external address bits indicative of the column address are changed from the block selecting line BS0 to the block selecting line BSn, and the test bits of logic "1" level are sequentially written into the memory cells M11 and M1b of the data storage blocks MB00 to MB0n without any change of the line address and the primary and secondary row addresses. The test bit of logic "1" level are written into the 2n memory cells during a single access by only changing the column address.

Subsequently, test bits of logic "0" level are applied to the input-and-output data pins 27a and 27b, and the line address is changed from the bit line pairs BL01/BL0b . . . BLn1/BLnb to the next bit line pairs. However, the primary and secondary row addresses are unchanged, and the column address returns to the block selecting line BS0. The write-in sequence is carried out again, and the test bits of logic "0" level is written into the memory cells next to the memory cells M11 and M1b of the data storage block MB00. The write-in sequence is repeated for the memory cells adjacent to the memory cells M11 and M1b by changing the column address from the block selecting line BS0 to the block selecting line BSn, and the test bit of logic "0" level are stored in the memory cells adjacent to the memory cells storing the test bits of logic "1" level.

Thus, the test bits of logic "1" level and the test bits of logic "0" level are alternately applied to the input-and-output data pins 27a and 27b, and are written into the rows of memory cells assigned the same primary and secondary row addresses by changing the column address and the line address.

Subsequently, when the line address and the column address return to the initial values, the secondary row address is changed from the row of memory cells M11 to M1j to the next row of memory cells. The test bits of logic "0" and test bits of logic "1" level are alternately applied to the input-and-output data pins 27a and 27b, and the test bit of logic "0" level and the test bit of logic "1" level are alternately written into the memory cells of the data storage blocks MB00 to MB0n assigned the selected secondary row address by changing the column address and the line address. The write-in sequence is repeated for all of the rows of memory cells incorporated in the data storage blocks MB00 to MB0n.

When all of the memory cells of the data storage blocks MB00 to MB0n store the test bit of logic "1" level and the test bit of logic "0" level, each test bit of logic "1" level is surrounded by the test bits of logic "0" level, and each test bit of logic "0" level is also surrounded by the test bits of logic "1" level. In other words, the test bits stored in each data storage block form a checker-like bit pattern.

Upon completion of the checker-like bit pattern in the first row of data storage blocks MB00 to MB0n, the primary row address is changed from the row of data storage blocks MB00 to MB0n to the data storage blocks MB10 to MB1n. The above described write-in sequence is repeated for the data storage blocks MB10 to MB1n, and the checker-like bit pattern is formed in the data storage blocks MB10 to MB1n.

When the test bits are written into the memory cells Mka and Mkj of the row of the data storage blocks MBm0 to MBmn, the test bit of logic "1" level and the test bit of logic "0" level have been alternately written into all of the data storage blocks MB00 to MBmn in the checker-like bit pattern, and the memory cells will be examined whether to keep the test bits or to lose them. If a memory cell loses the test bit, the read-out bit is changed in logic level.

After formation of the checker-like bit pattern in all of the data storage blocks MB00 to MBmn, the test bits stored therein are sequentially read out through the read-out sequence as follows. In the following description, the memory cells M11 and M1b of the data storage block MB01 are assumed to be defective, and the test bits are inverted to logic "0" level. However, if a memory cell is excellent, the test bit stored therein is not inverted.

Figure 7:
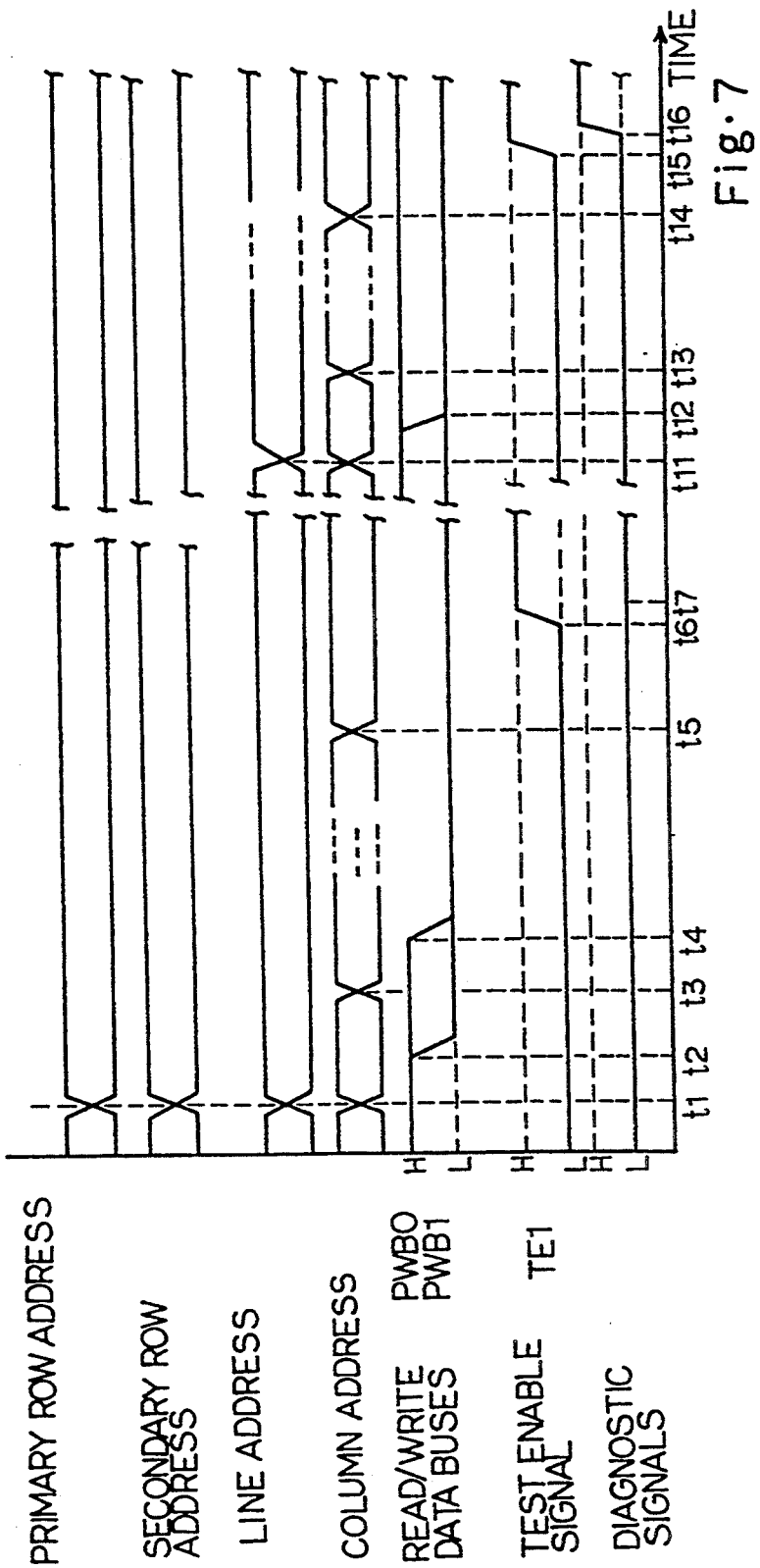
FIG. 7 is a timing chart showing a read-out phase in a parallel-bit testing sequence according to the present invention.

First, the precharging circuits 280 to 28n charge all of the bit line pairs BL01/BL0j to BLn1/BLnj to the intermediate voltage level, and the precharging circuit 29 charges the read and write data buses PWB0 and PWB1 to the high voltage level. As shown in FIG. 7, the primary and secondary row addresses, the line address and the column address are indicative of the memory cells M11 and M1b of the data storage block MB00 at time t1, and the test bits of logic "1" are read-out from the memory cells M11 and M1b of the data storage blocks MB00 through the read-out sequence. The non-inverted test bits are amplified by the sense amplifier circuits SA1 to SAj, and are transferred to the read amplifiers 250d. The read amplifiers 250d are responsive to the non-inverted test bits, and each read amplifier 250d discharges one of the data bus line of the associated read and write data bus PWB0 or PWB1 at time t2. However, the other data bus lines remain in the high voltage levels.

The column address is changed from the block selecting line BS0 to the subsequent block selecting line BS1 at time t3, and the inverted bits of logic "0" are read out from the memory cells M11 and M1b of the data storage block MB01 without any precharging on the bit line pairs and the read and write data buses PWB0/PWB1. After the amplification, the inverted test bits are transferred to the read amplifiers 250d, and the inverted test bits causes the read amplifiers 250d to discharge the other data bus lines at time t4. As a result, all of the data bus lines become low.

The column address is sequentially changed, and the non-inverted test bits are sequentially read out from the memory cells M11 and M1b of the other data storage blocks associated with the main word line group MWL01 to MWL0i without any precharging on the bit line pairs and on the read and write data buses PWB0/PWB1. While the primary and secondary row addresses and the line addresses are being fixed, the read and write data bus system PWB0/PWB1 are not precharged again, and the data bus lines are maintained in the low voltage level. The column address is finally changed to the block selecting line BSn at time t5, and the non-inverted test bits are transferred to the read amplifiers 250d. Then, the test enable signal TE1 goes up at time t6, and the exclusive-OR gates 30d are enabled with the complementary signal of the test enable signal. All of the data bus lines have been discharged, and logic "0" bits are supplied from the data bus lines of the associated bus to the exclusive-OR gate 30d. Then, the exclusive-OR gates 30d produce the judging signals JG1 and JG2 of the high voltage level indicative of the defective memory cells. The judging signals JG1 and JG2 are supplied to the output data buffers 26d, and the diagnostic signals of the low voltage level are produced and supplied to the input and output data pins 27a and 27b at time t7. The diagnostic signals of the low voltage level are indicative of the defective memory cells M11 and M1b. Thus, the 2n bits are sequentially checked to see whether or not they are consistent in a single access, and the diagnostic signals reports the results of the parallel-bit testing sequence to the outside thereof.

The primary and secondary row addresses are maintained, and the line address is changed from the M11 and M1b to the next or adjacent memory cells in the same row. Although the bit line pairs are not precharged, the read and write data buses PWB0/PWB1 are precharged by the precharging circuit 29 again. The column address returns to the block selecting line BS0. The non-inverted test bits of logic "0" level are read out from the adjacent memory cells of the data storage block MB00 through the read-out sequence at time t11, and are transferred to the read amplifiers 250d after the amplification by the sense amplifier circuits SA1 to SAj. After the line address is changed, the read and write data buses PWB0 and PWB1 are charged to the high voltage level again. Then, each of the read amplifiers 250d discharges one of the data bus lines of the associated bus at time t12, and allows the other data bus line to remain in the high voltage level.

The column address is changed to the block selecting line BS1 at time t13, and the non-inverted test bits are read out from the adjacent memory cells of the data storage block MB01 without any precharging on the bit line pairs and the read and write data buses PWB0/PWB1. The read amplifiers 250d continues to keep the other data bus lines in the high voltage level.

Finally, the column address is changed to the block selecting line BSn at time t14, and the non-inverted test bits are read out from the adjacent memory cells of the data storage block MB0n without any precharging on the bit lines and the read and write data buses PWB0/PWB1, and are transferred to the read amplifiers 250d. The read amplifiers 250d keep the other data bus lines in the high voltage level, and the high voltage level and the low voltage level are supplied from each read and write data bus to the associated exclusive-OR gate 30d. The test enable signal TE1 goes up to the high voltage level at time t15, and the exclusive-OR gates 30d produce the judging signals JG1 and JG2 of the high voltage level indicative of the excellent memory cells. The output data buffers 26d produces the diagnostic signals of the high voltage level at time t16, and supply the diagnostic signals to the input and output data pins 27a and 27b. The 2n test bits are sequentially checked in the parallel-bit testing sequence by changing the column address.

Thus, while the column address and the line address are being changed, the primary and secondary row addresses are fixed. However, when the line address returns to the memory cells M11 and M1b, the secondary row address is incremented, and the parallel-bit testing sequence is repeated by changing the column address and the line address as described hereinbefore.

When the secondary row address returns to the sub-word line SWL1, the primary row address is incremented, and the parallel-bit testing sequence is repeated by changing the column address, the line address and the secondary row address. When the primary row address returns to the main word lines MWL01/MWL0i, all of the test bits are checked to see whether to be consistent or not.

Thus, all of the memory cells are checked to see whether or not a defective memory cell is incorporated in the data storage blocks MB00 to MBmn. If defective memory cells are incorporated, a redundancy technology rescues the dynamic random access memory device.

As will be appreciated from the foregoing description, the dynamic random access memory device is subjected to the parallel-bit testing sequence in the presence of the test bits arranged in the checker-like bit pattern, and a defective memory cell is perfectly screened out for enhancing the reliability thereof.

Second Embodiment

A dynamic random access memory device implementing the second embodiment is similar to that of the first embodiment except for the parallel-bit testing sequence, and, for this reason, description on the circuit arrangement is not incorporated hereinbelow. The references designating the components of the first embodiment are used in the following description for better understanding.

Assuming now that the dynamic random access memory device enters the test mode, an external diagnostic system alternately arrange a test bit of logic "1" level and a test bit of logic "0" level over the data storage blocks MB00 to MBmn in the checker-like bit pattern as similar to the first embodiment.

First, the test bits of logic "1" level are applied to the input-and-output data pins 27a and 27b, respectively, and the external address bits select the memory cells M11 and M1b from the data storage block MB00. Although the test bits are transferred from the data amplifier units 250 to 25n through the selector units 230 to 23n to the bit line pairs BL01/BL0b to BLn1/BLnb in the form of potential difference, the test bits of logic "1" level are written into the selected memory cells M11 and M1b of the data storage block MB00 through the write-in sequence. The external address bits indicative of the primary row address are, then, changed from the main word line group MWL01/MWL0i to the main word line group MWL11/MWL1i, and are latched by the address buffer unit 31. The row address decoder 21 changes the selected main word line group from MWL01/MWL0i to MWL11/MW1i, and the test bits of logic "1" level already transferred to the bit line pairs BL01 and BL0b are stored in the memory cells M11 and M1b of the data storage block MB10.

In this way, the external address bits indicative of the primary row address are changed from the main word line group MWL01/MWL0i to the main word line group MWLm1/MWLmi, and the test bits of logic "1" level are written into the memory cells M11 and M1b of the data storage blocks MB00 to MBm0 without any change of the secondary row address, the line address and the column address. The test bit of logic "1" level are written into the 2m memory cells during a single access by only changing the primary row address.

Subsequently, test bits of logic "0" level are applied to the input-and-output data pins 27a and 27b, and the line address is changed from the bit line pairs BL01/BL0b to the next bit line pairs. The primary row address returns to the main word line group MWL01/MWL0i. However, the secondary row address and the column address are unchanged. The write-in sequence is carried out again, and the test bits of logic "0" level is written into the memory cells next to the memory cells M11 and M1b of the data storage block MB00. The write-in sequence is repeated for the memory cells adjacent to the memory cells M1 and M1b by changing the primary row address from the main word line group MWL01/MWL0i to the main word line group MWLm1/MWLmi, and the test bit of logic "0" level are stored in the memory cells adjacent to the memory cells storing the test bits of logic "1" level of the data storage blocks MB00 to MBm0.

Thus, the test bits of logic "1" level and the test bits of logic "0" level are alternately applied to the input-and-output data pins 27a and 27b, and are written into the rows of memory cells assigned the same secondary row address and the column address by changing the primary row address and the line address.

Subsequently, when the line address and the primary row address return to the initial values, the secondary row address is changed from the row of memory cells M11 to M1j to the next row of memory cells. The test bits of logic "0" and test bits of logic "1" level are alternately applied to the input-and-output data pins 27a and 27b, and the test bit of logic "0" level and the test bit of logic "1" level are alternately written into the memory cells of the data storage blocks MB00 to MBm0 assigned the same secondary row address by changing the primary row address and the line address. The write-in sequence is repeated for all of the rows of memory cells incorporated in the data storage blocks MB00 to MBm0.

When all of the memory cells of the data storage blocks MB00 to MBm0 store the test bit of logic "1" level and the test bit of logic "0" level, each test bit of logic "1" level is surrounded by the test bits of logic "0" level, and each test bit of logic "0" level is also surrounded by the test bits of logic "1" level. The checker-like bit pattern is formed in the data storage blocks MB00 to MBm0.

Upon completion of the checker-like bit pattern in the first column of data storage blocks MB00 to MBm0, the column address is changed from the block selecting line BS0 to the block selecting line BS1, and the primary and secondary row addresses and the line address return to the initial values, respectively. In other words, the primary and secondary row addresses, the line address and the column address select the memory cells M11 to M1b of the data storage block MB01. The above described write-in sequence is repeated for the data storage blocks MB01 to MBm1 by changing the primary row address, the line address and the secondary row address, and the checker-like bit pattern is formed in the data storage blocks MB01 to MBm1.

When the test bits are written into the memory cells Mka and Mkj of the column of the data storage blocks MB0n to MBmn, the test bit of logic "1" level and the test bit of logic "0" level have been alternately written into all of the data storage blocks MB00 to MBmn in the checker-like bit pattern, and the memory cells will be examined whether to keep the test bits or to lose them. If a memory cell loses the test bit, the read-out bit is changed in logic level.

After formation of the checker-like bit pattern in all of the data storage blocks MB00 to MBmn, the test bits stored therein are sequentially read out through the read-out sequence as follows. In the following description, the memory cells M11 and M1b of the data storage block MB10 are assumed to be defective, and the test bits are inverted to logic "0" level.

Figure 8:
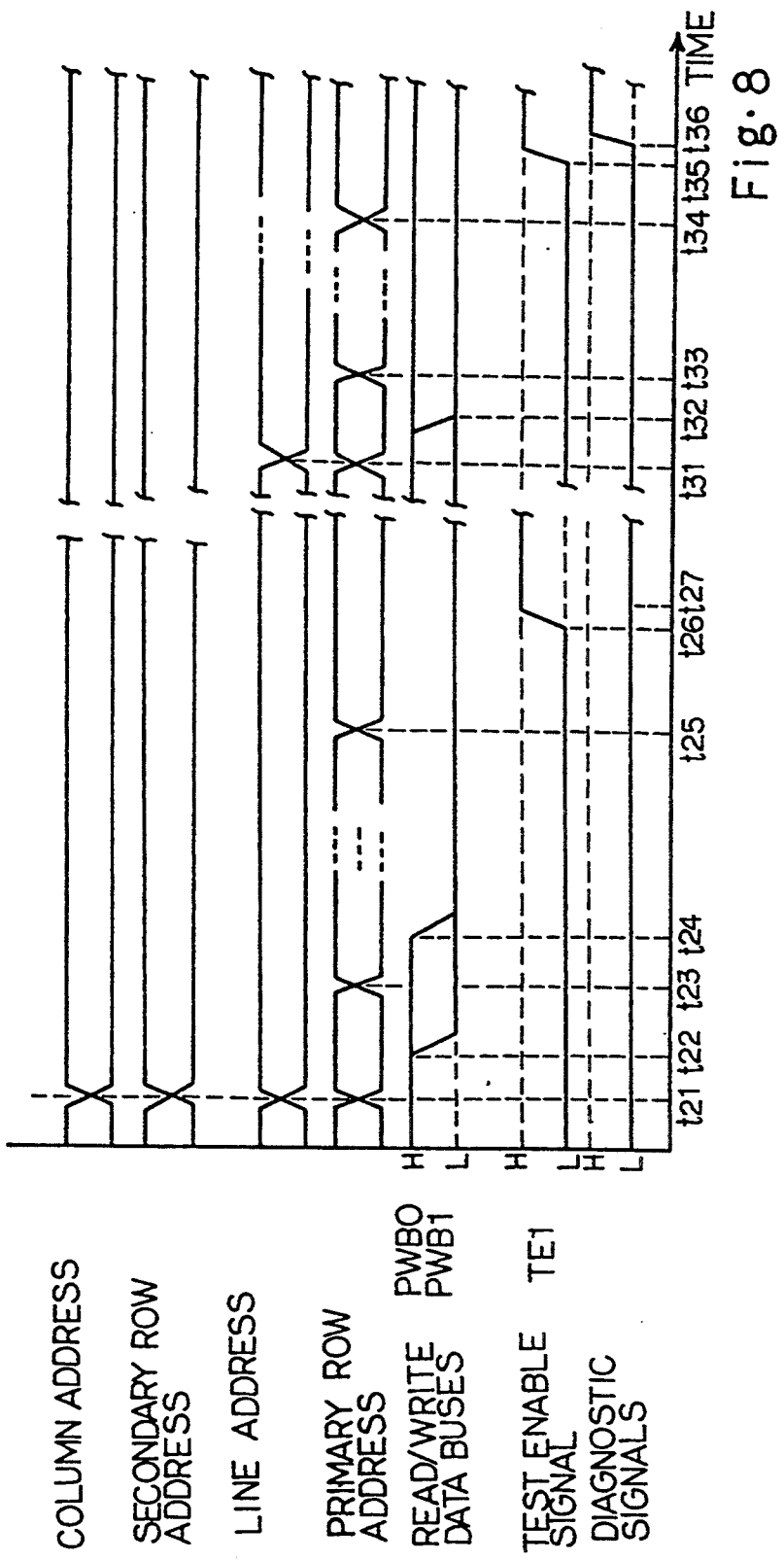
FIG. 8 is a timing chart showing a read-out phase in another parallel-bit testing sequence according to the present invention.

Referring to FIG. 8, the primary and secondary row addresses, the line address and the column address are indicative of the memory cells M11 and M1b of the data storage block MB00 at time t21, and the precharging circuit 280 charges the bit line pairs BL01/BL0j to the intermediate voltage level. The precharging circuit 29 charges the read and write data buses PWB0 and PWB1. The test bits of logic "1" level are read-out from the memory cells M11 and M1b of the data storage blocks MB00 through the read-out sequence. The non-inverted test bits of logic "1" level are amplified by the sense amplifier circuits SA1 to SAj, and are transferred to the read amplifiers 250d. The read amplifiers 250d are responsive to the non-inverted test bits, and each read amplifier 250d discharges one of the data bus line of the associated read and write data bus PWB0 or PWB1 at time t22. However, the other data bus lines remain in the high voltage levels.

After the precharging on the bit line pairs BL01/BL0j, the primary row address is changed from the main word line group MWL01/MWL0i to the subsequent main word line group MWL11/MWL1i at time t23, and the inverted bits of logic "0" are read out from the memory cells M11 and M1b of the data storage block MB10. However, the read and write data buses PWB0/PWB1 are not precharged. After the amplification by the sense amplifiers SA1 to SAj, the inverted test bits are transferred to the read amplifiers 250d, and the inverted test bits causes the read amplifiers 250d to discharge the other data bus lines at time t24. As a result, all of the data bus lines become low.

The primary row address is sequentially changed, and the non-inverted test bits are sequentially read out from the memory cells M11 and M1b of the other data storage blocks MB00 to MBm0 by changing the primary row address after the precharging on the bit line pairs BL01/BL0j. While the test bits are sequentially read out from the data storage blocks MB00 to MBm0, the read and write data bus system PWB0/PWB1 are not precharged again, and the data bus lines are maintained in the low voltage level. The primary row address is finally changed to the main word line group MWLm1/MWLmi at time t25, and the non-inverted test bits are transferred to the read amplifiers 250d after the amplification by the sense amplifier circuits SA1 to SAj. Then, the test enable signal TE1 goes up at time t26, and the exclusive-OR gates 30d are enabled with the complementary signal of the test enable signal. All of the data bus lines have been discharged, and logic "0" bits are supplied from the data bus lines of the associated bus to the exclusive-OR gate 30d. Then, the exclusive-OR gates 30d produce the judging signals JG1 and JG2 of the high voltage level indicative of the defective memory cells. The judging signals JG1 and JG2 are supplied to the output data buffers 26d, and the diagnostic signals of the low voltage level are produced and supplied to the input and output data pins 27a and 27b at time t27. The diagnostic signals of the low voltage level are indicative of the defective memory cells M11 and M1b. Thus, the 2m bits are sequentially checked to see whether or not they are consistent in a single access, and the diagnostic signals reports the results of the parallel-bit testing sequence to the outside thereof.

The secondary row address and the column address are maintained, and the line address is changed from the M11 and M1b to the next or adjacent memory cells in the same row. The primary row address returns to the main word line group MWL01/MWL0i, and the read and write data buses PWB0/PWB1 are precharged again. After the bit line pairs BL01/BL0j are precharged, the non-inverted test bits of logic "0" level are read out from the adjacent memory cells of the data storage block MB00 through the read-out sequence at time t31, and are transferred to the read amplifiers 250d after the amplification by the sense amplifier circuits SA1 to SAj. Then, each of the read amplifiers 250d discharges one of the data bus lines of the associated bus at time t32, and allows the other data bus line to remain in the high voltage level.

The primary row address is changed to the main word line group MWL11/MWL1i at time t33, and the bit line pairs BL01/BL0j are precharged again. However, the read and write data buses PWB0/PWB1 are not precharged. The non-inverted test bits of logic "0" level are read out from the adjacent memory cells of the data storage block MB10, and are amplified by the sense amplifier circuits SA1 to SAj. The read amplifiers 250d continues to keep the other data bus lines in the high voltage level.

Finally, the column address is changed to the main word line group MWLm1/MWLmi at time t34, and the bit line pairs BL01/BL0j are precharged. However, the read and write data buses PWB0/PWB1 are not precharged. The non-inverted test bits are read out from the adjacent memory cells of the data storage block MBm0, and are transferred to the read amplifiers 250d after the amplification by the sense amplifier circuits SA1 to SAj. The read amplifiers 250d keep the other data bus lines in the high voltage level, and the high voltage level and the low voltage level are supplied from each read and write data bus to the associated exclusive-OR gate 30d. The test enable signal TE1 goes up to the high voltage level at time t35, and the exclusive-OR gates produce the judging signals JG1 and JG2 of the high voltage level indicative of the excellent memory cells. The output data buffers 26d produces the diagnostic signals of the high voltage level at time t36, and supply the diagnostic signals to the input and output data pins 27a and 27b. The 2m test bits are sequentially checked in the next parallel-bit testing sequence by changing the primary row address.

Thus, while the primary row address and the line address are being changed, the secondary row address and the column address are fixed. However, when the line address returns to the memory cells M11 and M1b, the secondary row address is incremented without any change of the column address, and the parallel-bit testing sequence is repeated by changing the primary row address and the line address as described hereinbefore.

When the secondary row address returns to the sub-word line SWL1, the column address is incremented, and the parallel-bit testing sequence is repeated by changing the primary row address, the line address and the secondary row address. In this way, the parallel-bit testing sequence is repeated by changing the primary row address, the line address, the secondary row address and the column address, and all of the test bits are read out from the data storage blocks MB00 to MBmn to see whether to be consistent or inconsistent.

Thus, all of the memory cells are checked to see whether or not a defective memory cell is incorporated in the data storage blocks MB00 to MBmn. If defective memory cells are incorporated, a redundancy technology rescues the dynamic random access memory device.

If all of the data storage blocks MB00 to MBmn are respectively associated with bit line pair groups, the parallel-bit testing sequence may be carried out by changing the primary row address without any precharging on the bit line pairs.

In the first and second embodiments, the checker-like bit pattern is formed over the data storage blocks MB00 to MBmn, and either column or primary row address is sequentially changed in a single parallel-bit testing sequence. However, if test bits are alternately written into every row of memory cells, the secondary row address may be sequentially changed instead of the column address and the primary row address in the test mode. In this instance, the test bits may be sequentially read out from all of the data storage blocks MB00 to MBmn in a single parallel-bit testing sequence by changing not only the column address but also the secondary row address.

Third Embodiment

Figure 9:
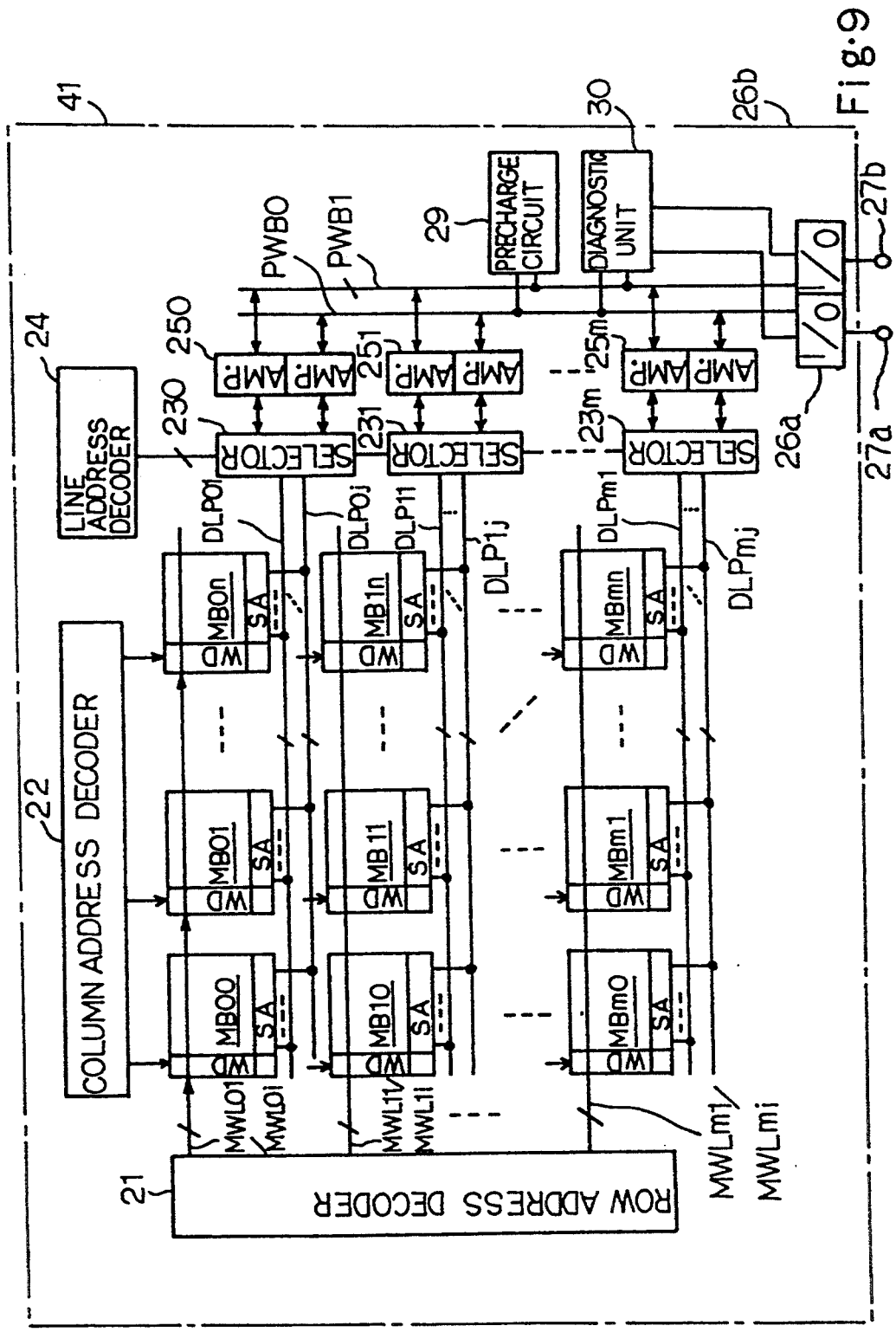
FIG. 9 is a circuit diagram showing the arrangement of another dynamic random access memory device according to the present invention.

Turning to FIG. 9 of the drawings, another dynamic random access memory device embodying the present invention is fabricated on a single semiconductor chip 41. FIG. 9 only shows an essential part of the dynamic random access memory device, and some units such as a test mode entry circuit, an address buffer unit and a timing generator are deleted therefrom. The dynamic random access memory device implementing the second embodiment is similar to the first embodiment except for data transfer line pair groups 410 to 41m, and the other components are labeled with the same references used in FIG. 3 without detailed description.

The data transfer line pair groups DLP01/DLP0j, DLP11/DLP1j, . . . and DLPm1/DLPmj, and are shared between the rows of data storage blocks MB00 to MBmn, respectively. Each of the data transfer line groups is constituted by the data transfer line pairs respectively connected between the associated selector unit and the bit line pairs, and transfers potential differences therebetween. The data transfer line pair groups DLP01/DLP0j to DLPm1/DLPmj extend in parallel to the main word lines MWL01/MWL0i to MWLm1/MWLmi and to the sub-word lines SWL1 to SWLk, and are not overlapped with the bit line pairs BL01/BL0j to BLn1/BLnj. Thus, the data transfer line pairs DLP01/DLP0j to DLPm1/DLPmj do not extend over the data storage blocks MB00 to MBmn, and are free from any capacitive coupling.

The dynamic random access memory device shown in FIG. 9 also selectively enters the standard mode and the test mode. However, the read-out sequence, the write-in sequence and the parallel-bit testing sequence are similar to those of the first embodiment, and no further description is incorporated hereinbelow for the sake of simplicity.

Although particular embodiments of the present invention have been shown and described, it will be obvious to those skilled in the art that various changes and modifications may be made without departing from the spirit and scope of the present invention. For example, the dynamic random access memory device according to the present invention may form a part of an ultra large scale integration together with other function blocks. A dynamic random access memory device may have an input-and-output data pin associated with a single read and write data bus or more than two input-and-output data pins associated with more than two read and write data buses. Moreover, various test bit patterns are diagnosed through the parallel-bit testing sequence according to the present invention.

What is claimed is:

1. A semiconductor dynamic random access memory device having a standard mode of operation for selectively writing data bits and selectively reading out said data bits, and a parallel testing mode of operation for sequentially writing test bits and sequentially reading out said test bits, comprising:
   a) a plurality of data storage blocks arranged in rows and columns, each of said plurality of data storage blocks having
      a-1) a plurality of addressable memory cells for respectively storing said data bits or said test bits,
      a-2) a plurality of sub-word lines selectively connected with said plurality of addressable memory cells, and selectively driven to an active level so that selected memory cells of said plurality of addressable memory cells become accessible,
      a-3) a partial decoder unit connected with said plurality of sub-word lines, and driving one of said sub-word lines to said active level, and
      a-4) a plurality of sense amplifier circuits selectively connected with said plurality of addressable memory cells for amplifying potential differences representing data bits read out from and written into selected addressable memory cells or said test bits;
   b) a plurality of block selecting lines respectively associated with the columns of data storage blocks, and selectively driven to an active level for enabling the partial decoder units of a column of data storage blocks;
   c) a column address decoder unit connected with said plurality of block selecting lines, and responsive to first address bits for driving one of said block selecting lines to said active level;
   d) a plurality of main word line groups respectively associated with the rows of said plurality of data storage blocks, and each said main word line groups connected with the partial decoder units of the data storage blocks in the associated row for allowing the partial decoder unit of one of said data storage blocks in the selected column to selectively drive said sub-word lines;
   e) a row address decoder unit connected with said plurality of main word line groups, and responsive to second address bits for selectively driving one of said plurality of main word line groups to an active level;
   f) a plurality of groups of data propagation paths respectively associated with said columns of data storage blocks, each group of data propagation paths being connected with the sense amplifier circuits of each of the data storage blocks in the associated column for transferring said potential differences;
   g) an input and output means coupled with signal pins, and operative to receive an input data and output an output data in said standard mode and to sequentially receive said test bits and output a diagnostic signal in said parallel testing mode, said input and output means having a read and write bus system for propagating said input data, said output data and said test bits in the form of potential difference;
   h) a plurality of line selecting means respectively associated with said plurality of groups of data propagation paths, and coupled between said plurality groups of data propagation paths and said read and write bus system, each selectively connecting the data propagation paths of the associated group of data propagation path with said read and write bus system, said block selecting lines being sequentially driven to said active level for writing each of said test bits into predetermined data storage blocks in said parallel testing mode, said block selecting lines being sequentially driven to said active level for reading out said data bits from said predetermined data storage blocks in said parallel testing mode; and
   i) a diagnostic means associated with said input and output means, and monitoring potential levels on said read and write bus system in said parallel testing mode to see whether or not the test bits sequentially read out from said predetermined data storage blocks are identical in logic level for producing said diagnostic signal indicative of consistence or inconsistence.

2. A semiconductor dynamic random access memory device as set forth in claim 1, in which said input and output means further comprises
   a precharging circuit connected with data bus lines of said read and write bus system for precharging to a first voltage level,
   a plurality of discharging transistors connected between said data bus lines and a line of constant voltage, and
   a read amplifier means responsive to the potential differences indicative of said output data or said test bits for causing said plurality of discharging transistors to selectively turn on, said precharging circuit being operative to precharge said read and write bus system before said test bits are sequentially read out from said predetermined data storage blocks in said parallel testing mode so that first predetermined data bus lines of said data bus lines and the remaining data bus lines are in the first voltage level and in the constant voltage level if all of the test bits are consistent in logic level with each other.

3. A semiconductor dynamic random access memory device as set forth in claim 1, further comprising a plurality of groups of data transfer line pairs respectively associated with the rows of data storage blocks and extending between areas of a semiconductor chip,
said areas being respectively assigned to said plurality of data storage blocks,
each group of data transfer line pairs being implemented by a plurality of data transfer line pairs,
each of said transfer line pairs being implemented by two transfer lines, and
each group of data transfer line pairs being coupled to the sense amplifier circuits of the associated row of data storage blocks and the associated line selecting means.

4. A semiconductor dynamic random access memory device having a standard mode of operation for selectively writing data bits and selectively reading out said data bits, and a parallel testing mode of operation for sequentially writing test bits and sequentially reading out said test bits, comprising:

a) a plurality of data storage blocks arranged in rows and columns, each of said plurality of data storage blocks having
  a-1) a plurality of addressable memory cells for respectively storing said data bits or said test bits,
  a-2) a plurality of sub-word lines selectively connected with said plurality of addressable memory cells, and selectively driven to an active level so that selected memory cells of said plurality of addressable memory cells become accessible,
  a-3) a partial decoder unit connected with said plurality of sub-word lines, and driving one of said sub-word lines to said active level, and
  a-4) a plurality of sense amplifier circuits selectively connected with said plurality of addressable memory cells for amplifying potential differences indicative of said data bits or said test bits;

b) a plurality of block selecting lines respectively associated with the columns of data storage blocks, and selectively driven to an active level for enabling the partial decoder units of a column of data storage blocks;

c) a column address decoder unit connected with said plurality of block selecting lines, and responsive to first address bits for driving one of said block selecting lines to said active level;

d) a plurality of main word line groups respectively associated with the rows of said plurality of data storage blocks, and each connected with the partial decoder units of the data storage blocks in the associated row for allowing the partial decoder unit of one of said data storage blocks in the selected column to selectively drive said sub-word lines;

e) a row address decoder unit connected with said plurality of main word line groups, and responsive to second address bits for selectively driving one of said plurality of main word line groups to an active level, said row address decoder unit being operative to sequentially drive said plurality of main word line groups in said parallel testing mode for writing each of said test bits into predetermined data storage blocks, said row address decoder unit further being operative to sequentially drive said plurality of main word line groups in said parallel testing mode so that the test bits are read out from said predetermined data storage blocks;

f) a plurality of groups of data propagation paths respectively associated with said columns of data storage blocks, each group of data propagation paths being connected with the sense amplifier circuits of each of the data storage blocks in the associated column for transferring said potential differences;

g) an input and output means operative to receive an input data and output an output data in said standard mode and to sequentially receive said test bits and output a diagnostic signal in said parallel testing mode, and having a read and write bus system for propagating said input data, said output data and said test bits in the form of potential difference;

h) a plurality of line selecting means respectively associated with said plurality groups of data propagation paths, and each selectively connecting the data propagation paths of the associated group with said read and write bus system; and i) a diagnostic means associated with said input and output means, and monitoring potential levels on said read and write bus system in said parallel testing mode to see whether or not the test bits sequentially read out from said predetermined data storage blocks are identical in logic level for producing said diagnostic signal indicative of consistence or inconsistence.

* * * * *

UNITED STATES PATENT AND TRADEMARK OFFICE
CERTIFICATE OF CORRECTION

PATENT NO.    : 5,436,910
DATED         : July 25, 1995
INVENTOR(S)   : Toshio TAKESHIMA, Tadahiko SUGIBAYASHI and Isao NARITAKE It is certified that error(s) appears in the above-identified patent and that said Letters Patent is hereby corrected as shown below:

Col. 2, line 56, delete "patter" and insert --pattern--.

Col. 4, line 43, delete "2In" and insert --In--.

Col. 6, line 35, delete "wring" and insert --writing--.

Col. 7, line 66, delete "BL ;" and insert --BLn;--.

Col. 8, line 20, delete "Dl12" and insert --DL12--.

Col. 8, line 24, delete "ad" and insert --and--.

Col. 8, line 43, delte "ward" and insert --word--.

Col. 17, line 12, delete "MW1i" and insert --MWL1i--.

Col. 17, line 37, delete "M1" and insert --M11--.

Signed and Sealed this

Fourth Day of June, 1996

Attest:

BRUCE LEHMAN

*Attesting Officer*     *Commissioner of Patents and Trademarks*